(12) United States Patent
Kariya et al.

(10) Patent No.: US 7,971,354 B2
(45) Date of Patent: Jul. 5, 2011

(54) METHOD OF MANUFACTURING A MULTILAYER PRINTED WIRING BOARD

(75) Inventors: Takashi Kariya, Ibi-gun (JP); Toshiki Furutani, Ibi-gun (JP)

(73) Assignee: Ibiden Co., Ltd., Ogaki-shi (JP)

(*) Notice: Subject to any disclaimer, the term of this patent is extended or adjusted under 35 U.S.C. 154(b) by 0 days.

(21) Appl. No.: 12/652,255

(22) Filed: Jan. 5, 2010

(65) Prior Publication Data

US 2010/0108637 A1    May 6, 2010

Related U.S. Application Data

(60) Division of application No. 11/397,802, filed on Apr. 5, 2006, now Pat. No. 7,754,978, which is a continuation of application No. PCT/JP2005/001628, filed on Jan. 28, 2005.

(30) Foreign Application Priority Data

| Jan. 30, 2004 | (JP) | 2004-023271 |
| May 10, 2004 | (JP) | 2004-139862 |

(51) Int. Cl.
*H05K 3/02* (2006.01)
(52) U.S. Cl. ........ 29/847; 29/825; 29/829; 29/831; 29/846; 29/874; 216/19; 216/36
(58) Field of Classification Search .......... 29/847, 29/825, 829, 831, 846, 849, 874; 174/250, 174/254, 261, 267; 216/19, 20, 36, 48; 361/760, 361/774, 795, 803
See application file for complete search history.

(56) References Cited

U.S. PATENT DOCUMENTS

| 5,116,459 | A | * | 5/1992 | Kordus et al. .......... 216/20 |
| 6,208,525 | B1 | | 3/2001 | Imasu et al. |
| 6,828,669 | B2 | | 12/2004 | Iijima et al. |
| 2001/0035299 | A1 | | 11/2001 | Achari et al. |
| 2003/0034565 | A1 | | 2/2003 | Lan et al. |

FOREIGN PATENT DOCUMENTS

| EP | 0 805 614 A1 | 11/1997 |
| JP | 58-028848 A | 2/1983 |
| JP | 5-47842 | 2/1993 |
| JP | 6-350250 | 12/1994 |
| JP | 2000-114698 | 4/2000 |
| JP | 2001-036253 A | 2/2001 |
| JP | 2001-085802 A | 3/2001 |
| JP | 2001-298272 A | 10/2001 |
| JP | 2003-8228 | 1/2003 |

OTHER PUBLICATIONS

U.S. Appl. No. 12/647,015, filed Dec. 24, 2009, Kariya, et al.

* cited by examiner

*Primary Examiner* — Thiem Phan
(74) *Attorney, Agent, or Firm* — Oblon, Spivak, McClelland, Maier & Neustadt, L.L.P.

(57) ABSTRACT

A multilayer printed wiring board manufacturing method including forming conductor posts, which are of substantially uniform thickness and with which the top surfaces are protected by a resist, on a conductor pattern disposed on an upper surface of a build-up layer formed on a core substrate, shaping the conductor posts to have a constriction by adjusting the time of immersion in an etching solution that etches the conductor posts, forming a low elastic modulus layer of substantially the same height as the conductor posts after removing the resist at the top surfaces, and forming mounting electrodes on upper surfaces of the conductor posts.

8 Claims, 9 Drawing Sheets

Fig. 9

| Examples | Shape of conductor post | | | | Percentage variation of electrical resistance (%) | | | |
|---|---|---|---|---|---|---|---|---|
| | Height (μm) | Minimum diameter (μm) | Maximum diameter (μm) | Aspect Ratio | At 500th cycle | At 750th cycle | At 1000th cycle | At 1500th cycle |
| 1 | 200 | 100 | 100 | 2 | × | × | × | × |
| 2 | 200 | 60 | 60 | 3.3 | × | × | × | × |
| 3 | 200 | 50 | 50 | 4 | ○ | ○ | △ | △ |
| 4 | 200 | 40 | 40 | 5 | ○ | ○ | ○ | △ |
| 5 | 200 | 100 | 120 | 2 | ○ | × | × | × |
| 6 | 200 | 60 | 120 | 3.3 | ○ | △ | × | × |
| 7 | 200 | 50 | 120 | 4 | ○ | ○ | ○ | ○ |
| 8 | 200 | 40 | 120 | 5 | ○ | ○ | ○ | ○ |
| 9 | 200 | 40 | 80 | 5 | ○ | ○ | ○ | ○ |
| 10 | 200 | 35 | 80 | 5.7 | ○ | ○ | ○ | ○ |
| 11 | 200 | 10 | 10 | 20 | × | × | × | × |
| 12 | 200 | 10 | 50 | 20 | × | × | × | × |

| Examples | Shape of conductor post | | Voltage drop amount(V) | Erroneous operation of IC |
|---|---|---|---|---|
| | Maximum diameter (μm) | Minimum diameter (μm) | | |
| 13 | 40 | 18 | 0.253 | Occurred |
| 14 | 40 | 25 | 0.235 | Occurred |
| 15 | 40 | 30 | 0.207 | Did not occur |
| 16 | 40 | 33 | 0.163 | Did not occur |
| 17 | 40 | 35 | 0.150 | Did not occur |
| 18 | 40 | 40 | 0.140 | Did not occur |

| Simulation No. | Aspect ratio of conductor post | Stress ratio |
|---|---|---|
| 1 | 1 | 1 |
| 2 | 2 | 0.92 |
| 3 | 3 | 0.87 |
| 4 | 4 | 0.65 |
| 5 | 5 | 0.45 |
| 6 | 6 | 0.40 |
| 7 | 7 | 0.32 |

Fig. 13

| Examples | Shape of conductor post | | | | | Number of heat cycle | | | | | | |
|---|---|---|---|---|---|---|---|---|---|---|---|---|
| | Height | Minimum diameter | Maximum diameter | Rasp | Maximum/Minimum | 500 | 750 | 1000 | 1500 | 1750 | 2000 | 2500 |
| 19 | 200 | 100 | 120 | 2.0 | 1.2 | ○ | × | × | × | × | × | × |
| 20 | 200 | 60 | 120 | 3.3 | 2.0 | ○ | △ | × | × | × | × | × |
| 21 | 100 | 25 | 50 | 4.0 | 2.0 | ○ | ○ | ○ | △ | × | × | × |
| 22 | 125 | 31 | 110 | 4.0 | 3.5 | ○ | ○ | ○ | ○ | ○ | ○ | ○ |
| 23 | 200 | 50 | 120 | 4.0 | 2.4 | ○ | ○ | ○ | ○ | ○ | ○ | ○ |
| 24 | 240 | 60 | 120 | 4.0 | 2.0 | ○ | ○ | ○ | ○ | ○ | ○ | ○ |
| 25 | 125 | 31 | 60 | 4.0 | 1.9 | ○ | ○ | ○ | ○ | ○ | △ | × |
| 26 | 200 | 50 | 80 | 4.0 | 1.6 | ○ | ○ | ○ | ○ | ○ | △ | × |
| 27 | 240 | 60 | 100 | 4.0 | 1.7 | ○ | ○ | ○ | ○ | ○ | △ | × |
| 28 | 260 | 65 | 130 | 4.0 | 2.0 | ○ | ○ | ○ | ○ | △ | × | × |
| 29 | 320 | 80 | 160 | 4.0 | 2.0 | ○ | ○ | ○ | ○ | △ | × | × |
| 30 | 340 | 85 | 200 | 4.0 | 2.4 | ○ | ○ | ○ | △ | × | × | × |
| 31 | 200 | 40 | 80 | 5.0 | 2.0 | ○ | ○ | ○ | ○ | ○ | ○ | ○ |
| 32 | 200 | 40 | 120 | 5.0 | 3.0 | ○ | ○ | ○ | ○ | ○ | ○ | ○ |
| 33 | 200 | 35 | 120 | 5.7 | 3.4 | ○ | ○ | ○ | ○ | ○ | ○ | ○ |
| 34 | 175 | 27 | 80 | 6.5 | 3.0 | ○ | ○ | ○ | △ | × | × | × |
| 35 | 200 | 31 | 100 | 6.5 | 3.2 | ○ | ○ | ○ | ○ | ○ | ○ | ○ |
| 36 | 325 | 50 | 100 | 6.5 | 2.0 | ○ | ○ | ○ | ○ | ○ | ○ | ○ |
| 37 | 390 | 60 | 120 | 6.5 | 2.0 | ○ | ○ | ○ | ○ | ○ | ○ | ○ |
| 38 | 200 | 31 | 60 | 6.5 | 1.9 | ○ | ○ | ○ | ○ | ○ | △ | × |
| 39 | 325 | 50 | 80 | 6.5 | 1.6 | ○ | ○ | ○ | ○ | ○ | △ | × |
| 40 | 390 | 60 | 100 | 6.5 | 1.7 | ○ | ○ | ○ | ○ | ○ | △ | × |
| 41 | 420 | 65 | 130 | 6.5 | 2.0 | ○ | ○ | ○ | ○ | △ | × | × |
| 42 | 520 | 80 | 200 | 6.5 | 2.5 | ○ | ○ | ○ | ○ | △ | × | × |
| 43 | 540 | 83 | 200 | 6.5 | 2.4 | ○ | ○ | ○ | △ | × | × | × |
| 44 | 230 | 33 | 70 | 7.0 | 2.1 | ○ | ○ | ○ | ○ | × | × | × |
| 45 | 350 | 50 | 100 | 7.0 | 2.0 | ○ | ○ | ○ | ○ | × | × | × |
| 46 | 420 | 60 | 120 | 7.0 | 2.0 | ○ | ○ | ○ | ○ | × | × | × |
| 47 | 330 | 33 | 70 | 10.0 | 2.1 | ○ | ○ | ○ | ○ | × | × | × |
| 48 | 400 | 32 | 70 | 12.5 | 2.2 | ○ | ○ | ○ | ○ | × | × | × |
| 49 | 515 | 31 | 70 | 16.6 | 2.3 | ○ | ○ | ○ | ○ | × | × | × |
| 50 | 200 | 10 | 50 | 20.0 | 5.0 | × | × | × | × | × | × | × |
| 51 | 620 | 31 | 50 | 20.0 | 1.6 | × | × | × | × | × | × | × |
| 52 | 200 | 100 | 100 | 2.0 | 1.0 | × | × | × | × | × | × | × |
| 53 | 200 | 60 | 60 | 3.3 | 1.0 | × | × | × | × | × | × | × |
| 54 | 100 | 25 | 25 | 4.0 | 1.0 | ○ | ○ | △ | × | × | × | × |
| 55 | 124 | 31 | 31 | 4.0 | 1.0 | ○ | ○ | ○ | △ | × | × | × |
| 56 | 200 | 50 | 50 | 4.0 | 1.0 | ○ | ○ | ○ | △ | × | × | × |
| 57 | 240 | 60 | 60 | 4.0 | 1.0 | ○ | ○ | ○ | △ | × | × | × |
| 58 | 250 | 62 | 62 | 4.0 | 1.0 | ○ | ○ | ○ | × | × | × | × |
| 59 | 320 | 80 | 80 | 4.0 | 1.0 | ○ | ○ | ○ | × | × | × | × |
| 60 | 340 | 85 | 85 | 4.0 | 1.0 | ○ | ○ | △ | × | × | × | × |
| 61 | 200 | 40 | 40 | 5.0 | 1.0 | ○ | ○ | ○ | △ | × | × | × |
| 62 | 175 | 27 | 27 | 6.5 | 1.0 | ○ | ○ | △ | × | × | × | × |
| 63 | 200 | 31 | 31 | 6.5 | 1.0 | ○ | ○ | ○ | △ | × | × | × |
| 64 | 325 | 50 | 50 | 6.5 | 1.0 | ○ | ○ | ○ | △ | × | × | × |
| 65 | 390 | 60 | 60 | 6.5 | 1.0 | ○ | ○ | ○ | △ | × | × | × |
| 66 | 410 | 63 | 63 | 6.5 | 1.0 | ○ | ○ | ○ | × | × | × | × |
| 67 | 520 | 80 | 80 | 6.5 | 1.0 | ○ | ○ | ○ | × | × | × | × |
| 68 | 540 | 83 | 83 | 6.5 | 1.0 | ○ | ○ | △ | × | × | × | × |
| 69 | 245 | 35 | 35 | 7.0 | 1.0 | ○ | ○ | ○ | × | × | × | × |
| 70 | 330 | 33 | 33 | 10.0 | 1.0 | ○ | ○ | △ | × | × | × | × |
| 71 | 400 | 32 | 32 | 12.5 | 1.0 | ○ | ○ | △ | × | × | × | × |
| 72 | 515 | 31 | 31 | 16.6 | 1.0 | ○ | ○ | △ | × | × | × | × |
| 73 | 200 | 10 | 10 | 20.0 | 1.0 | × | × | × | × | × | × | × |

The height, minimum diameter, and maximum diameter are in units of $\mu m$

METHOD OF MANUFACTURING A MULTILAYER PRINTED WIRING BOARD

CROSS-REFERENCE TO RELATED APPLICATIONS

This application is a divisional application of and claims benefit of priority from U.S. application Ser. No. 11/397,802, filed Apr. 5, 2006, the entire contents of which are hereby incorporated by reference. U.S. application Ser. No. 11/397,802 is a continuation application of International Application No. PCT/JP2005/001628, filed Jan. 28, 2005.

BACKGROUND ART

1. Field of the Invention

The invention relates to a multilayer printed wiring board and a method of manufacturing the same.

2. Description of the Prior Art

A proposed multilayer printed wiring board includes a stress relaxing layer of low elastic modulus disposed on the build-up layer, mounting electrodes that are disposed on the upper surface of this stress relaxing layer, and a conductor pattern on the build-up layer connected to the mounting electrodes by conductive posts (see Japanese Published Unexamined Patent Application No. 58-28848 and Japanese Published Unexamined Patent Application No. 2001-36253). For example, Japanese Published Unexamined Patent Application No. 2001-36253 discloses a multilayer printed wiring board 100, in which a low elastic modulus layer 140 is laminated onto the upper surface of a build-up layer 130, and a conductor pattern 132 on the upper surface of the build-up layer 130 and mounting electrodes 142, formed on the upper surface of the low elastic modulus layer 140, are connected by via holes 150 as shown in FIG. 12.

SUMMARY OF THE INVENTION

An object of the present invention is to provide a multilayer printed wiring board, with which the breakdown of connection with an electronic element due to thermal expansion and thermal contraction can be prevented and power can be supplied to the electronic element with stability. Another object of the invention is to provide a method of manufacturing such a multilayer printed wiring board.

The present invention is directed to a multilayer printed wiring board includes: a core substrate; a build-up layer that is formed on the core substrate and has a conductor pattern disposed on an upper surface; a low elastic modulus layer, formed on the build-up layer; mounting electrodes that are disposed on an upper surface of the low elastic modulus layer and connected via connecting portions to an electronic element; and conductor posts, passing through the low elastic modulus layer and electrically connecting the mounting electrodes with the conductor pattern; and the aspect ratio Rasp of the conductor posts is not less than 4 and is less than 20.

With this multilayer printed wiring board, since the aspect ratio Rasp of the conductor posts is not less than 4 and is less than 20, even when stress arises due to the difference in thermal expansion coefficients of the core substrate and the electronic element, this stress can be relaxed definitely and the breakdown of connection with the electronic element due to thermal expansion and thermal contraction can be prevented. The percentage variation of the electrical resistance when heating and cooling are repeated can also be restrained to a low level and power can be supplied with stability to the mounted electronic element. It is presumed that such effects can be obtained since the aspect ratio Rasp of the conductor posts is high and the conductor posts can thus deform in accordance with the low elastic modulus layer. In the present invention, the conductor post aspect ratio Rasp refers to: conductor post height/conductor post diameter (the minimum diameter in the case where the diameter is not uniform).

In the multilayer printed wiring board of the invention, the conductor post aspect ratio Rasp of less than 4 is not preferable since the electrical resistance will then vary greatly when heating and cooling are repeated, and the aspect ratio Rasp of not less than 20 is not preferable since cracks may then be formed in the conductor posts when heating and cooling are repeated. In other words, the aspect ratio Rasp of less than 4 is not preferable since the conductor posts will then not deform, thus impeding the deformation of the low elastic modulus layer, and the aspect ratio Rasp of not less than 20 is not preferable since the conductor posts will then deform too much and undergo breakage due to fatigue. The aspect ratio Rasp is preferably not less than 4 and not more than 6.5.

In the multilayer printed wiring board of the invention, the diameter of the conductor posts preferably exceeds 30 μm. With this diameter, voltage drops in the process of supplying power to the mounted electronic element can be restrained and erroneous operation of the electronic element can thus be prevented. The electrical resistance of the conductor posts can also be kept low. When the electronic element is an IC chip of not more than 1 GHz, voltage drops will not occur readily even if the conductor posts are not more than 30 μm in diameter. However, when the electronic element is a high-speed IC chip of not less than 3 GHz, since voltage drops will become prevalent, the conductor posts are preferably made to exceed 30 μm in diameter. In the case where a conductor post is not of uniform diameter, the diameter of the thinnest portion preferably exceeds 30 μm. This ensures low conductor resistance of the conductor post and improved resistance against fatigue degradation and heat cycles. The diameter of the conductor posts preferably exceeds 30 μm and is not more than 60 μm.

In the multilayer printed wiring board of the invention, the conductor posts may be formed to a shape with a constriction. In this case, the percentage variation of the electrical resistance when heating and cooling are repeated can be restrained further in comparison to conductor posts of substantially straight shapes. This is because each conductor post will deform with the constriction as the center (starting point) and in accordance with the low elastic modulus layer. Here, a constriction refers to a portion that is thinner than an upper portion and a lower portion when a conductor post is viewed along the axial direction. With the conductor posts having such a shape with a constriction, the ratio of the diameter of the thickest portion with respect to the diameter of the thinnest portion (thickest portion/thinnest portion) of the conductor posts is preferably not less than 2.

In the multilayer printed wiring board of the invention, the mounting electrodes may be the top surface of the conductor posts and formed to be substantially coplanar with the upper surface of the low elastic modulus layer. In this case, manufacture can be simplified in comparison to the case where the mounting electrodes are formed separately from the conductor posts.

In the multilayer printed wiring board of the invention, the low elastic modulus layer preferably has a Young's modulus at 30° C. of 10 MPa to 1 GPa. In this case, the stress due to the thermal expansion coefficient difference can be relaxed more definitely. The Young's modulus at 30° C. of the low elastic modulus layer is more preferably 10 MPa to 300 MPa and most preferably 10 MPa to 100 MPa. Also, the conductor posts are preferably formed of material of good conductivity and are preferably formed, for example, of copper, solder, or an alloy containing either of these materials.

The present invention is also directed to a method of manufacturing the multilayer printed wiring board having conductor posts of shapes with constrictions. The method includes the steps of: (a) forming conductor posts, which are of substantially uniform thickness and with which the top surfaces are protected by a resist, on a conductor pattern disposed on an upper surface of a build-up layer formed on a core substrate; (b) forming the conductor posts to a shape with a constriction by adjusting the time of immersion in an etching solution that etches the conductor posts; (c) forming a low elastic modulus layer of substantially the same height as the conductor posts after removing the resist at the top surfaces; and (d) forming mounting electrodes on upper surfaces of the conductor posts.

With the method of manufacturing the multilayer printed wiring board above, by adjusting the time of immersion in the etching solution, that is, the etching time in the etching step (the step (b)), the conductor posts can be formed to a shape with a constriction. The relationship between the etching time and the conductor post shape may be set suitably in accordance with the type of etching solution and the material of the conductor posts by performing experiments in advance.

BRIEF DESCRIPTION OF THE DRAWINGS

FIG. 9 is a table of the relationship between the conductor post shape and the percentage variation of the electrical resistance;

FIG. 13 is a table of the relationship between the conductor post shape and the percentage variation of the electrical resistance.

BEST MODE FOR CARRYING OUT THE INVENTION

Figure 1:
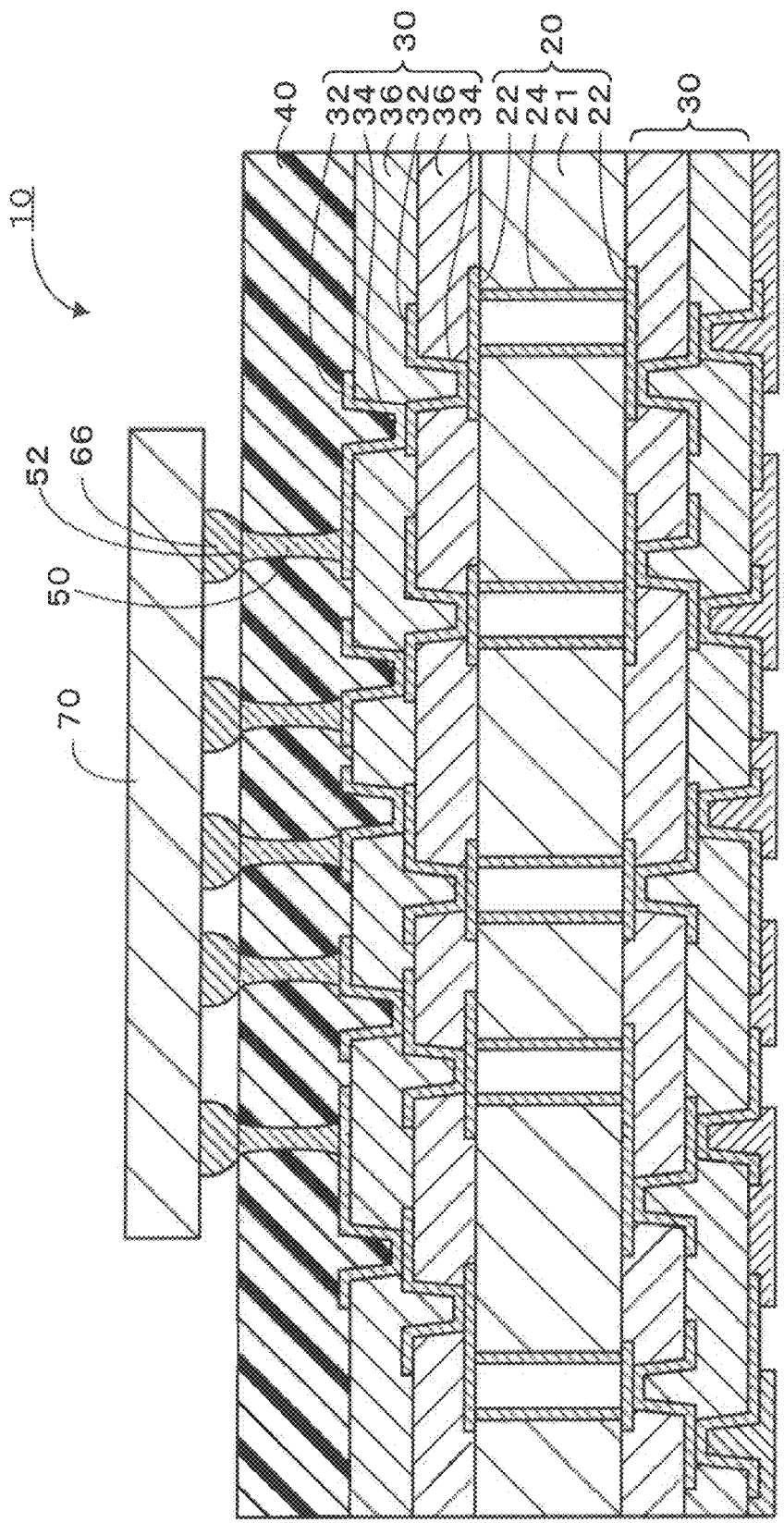
FIG. 1 is a sectional view of a multilayer printed wiring board of the embodiment.

An embodiment of the present invention shall now be described with reference to drawings. FIG. 1 is a sectional view of a multilayer printed wiring board, which is an embodiment of this invention. Though the expressions "upper" and "lower" shall be used below, these simply express relative positional relationships for descriptive purposes and, for example, upper and lower sides may be interchanged or upper and lower sides may be replaced by left and right sides.

As shown in FIG. 1, this embodiment's multilayer printed wiring board 10 includes: a core substrate 20, with which wiring patterns 22 formed on both the upper and lower surfaces are electrically connected with each other via through hole conductors 24; build-up layers 30, with which a plurality of conductor patterns 32 and 32 that are laminated across resin insulating layers 36 at the upper and lower sides of the core substrate 20 are electrically connected by means of via holes 34; a low elastic modulus layer 40 formed of a low elastic modulus material on the upper side of a build-up layer 30; lands (mounting electrodes) 52, on which a semiconductor chip 70 that is an electronic element is mounted via solder bumps 66; and conductor posts 50, which pass through the low elastic modulus layer 40 and electrically connect lands 52 with conductor patterns 32 formed on the upper surface of the build-up layer 30.

The core substrate 20 has wiring patterns 22 formed of copper at both the upper and lower surfaces of a core substrate main body 21, formed of BT (bismaleimide-triazine) resin or a glass epoxy resin, etc., and through hole conductors 24 formed of copper on inner peripheral surfaces of through holes that pass through from the top to back of the core substrate main body 21. The wiring patterns 22 at the respective surfaces are electrically connected via through hole conductors 24.

Build-up layers 30 are arranged by laminating resin insulating layers 36 and conductor patterns 32 alternatingly on both the upper and lower surfaces of the core substrate 20, and the electrical connections of wiring patterns 22 of the core substrate 20 and conductor patterns 32 of build-up layers 30 and the electrical connections of conductor patterns 32 and 32 of build-up layers 30 with each other are secured by means of via holes 34, which pass through from the upper to lower sides of resin insulating layers 36. Such build-up layers 30 are formed by any of known subtractive methods and additive methods (including semi-additive methods and full additive methods). Specifically, the build-up layers 30 are formed as follows. First, resin sheets that are to become resin insulating layers 36 are adhered onto both the upper and lower surfaces of the core substrate 20. Each resin sheet is formed of a modified epoxy based sheet, a polyphenylene ether based resin sheet, polyimide based resin sheet, cyanoester based resin sheet, etc., the thickness thereof is approximately 20 to 80 μm, and the Young's modulus at room temperature is 2 to 7 GPa. This resin sheet may have an inorganic filler dispersed therein. In the present example, a thermosetting resin film made by AJINOMOTO Co., Inc. (trade name: ABF-45SH; Young's modulus: 3.0 GPa) was used. Through holes are then formed in the adhered resin sheets by means of a carbon dioxide gas laser, UV laser, YAG laser, excimer laser, etc. Electroless copper plating is then applied, exposure and development are carried out upon forming resists on the electroless copper plating layers, and after applying electrolytic copper plating on portions at which the resists are not formed, the resists are removed, and wiring patterns 32 are formed using a sulfuric acid—hydrogen peroxide based etching solution to etch the electroless copper plating at portions at which the resists had existed. The conductive layers at the interiors of the through holes become via holes 34. This procedure is then repeated to form build-up layers 30.

The low elastic modulus layer 40 is formed of an elastic material with a Young's modulus at 30° C. of 10 to 1000 MPa (preferably 10 to 300 MPa and more preferably 10 to 100 MPa). Even if stress occurs due to a difference in the thermal expansion coefficients of the semiconductor chip 70, which is electrically connected to lands 52 via bumps 66, and the core substrate 20, the Young's modulus of the low elastic modulus layer 40 within this range relaxes the stress. Resins, which have a Young's modulus in the above-described range and in which a rubber-based component, such as polybutadiene, silicone rubber, urethane, SER, or NBR, or an inorganic component, such as silica, alumina, or zirconia, is dispersed in a thermosetting resin, such as epoxy resin, imide based resin, or phenol resin, silicone resin, or a thermoplastic resin, such as a polyolefin based resin, vinyl based resin, or an imide based resin, can be cited as examples of the elastic material used for the low elastic modulus layer 40. One type or two or more types of the components may be dispersed in the resin, and both rubber components and inorganic components may be dispersed. In the case of a thermosetting resin, a curing agent, such as dicyandiamide, may be dispersed. In the present example, a resin, with which 60 vol % of urethane resin is dispersed in an epoxy resin, having a curing agent dispersed therein, is used as the elastic material of the low elastic modulus layer 40.

Conductor posts 50 are formed of copper as the main component and so as to pass through the low elastic modulus layer 40 in the vertical direction and electrically connect lands 52 with a conductor pattern 32 disposed on the upper surface of the build-up layer 30. The conductor posts 50 are formed to a shape with a constriction or specifically, a shape with which the diameter of an intermediate portion is smaller than the diameter of an upper portion and the diameter of a lower portion. In the present example, the diameter of the upper portion is 80 μm, the diameter of the lower portion is 80 μm, the diameter of the intermediate portion is 35 μm, and the height is 200 μm. The aspect ratio Rasp of these conductor posts 50 is thus 5.7, which is the ratio of the height of the conductor post with respect to the diameter of the thinnest intermediate portion. The ratio of the diameter of the thickest upper portion with respect to the diameter of the thinnest intermediate portion is 2.3.

Lands 52 are the top surfaces of the respective conductor posts 50 that are exposed from the low elastic modulus layer 40. After being subject to nickel plating and subsequent gold plating, the lands 52 are connected to electrode portions of the semiconductor chip 70 via solder bumps 66.

An example of manufacturing the multilayer printed wiring board 10 shall now be described. Since the procedures for preparing the core substrate 20 and build-up layer 30 are well known, the description here shall mainly concern the procedures for preparing the low elastic modulus layer 40, conductor posts 50, and lands 52. FIGS. 2 to 7 are explanatory diagrams of these procedures.

Figure 2:
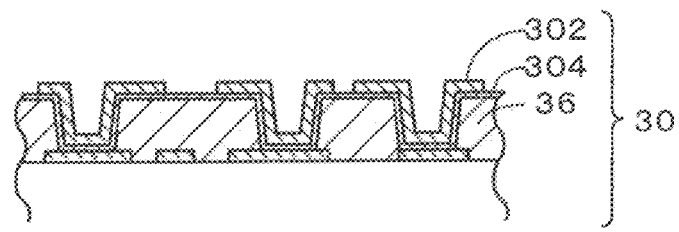
FIG. 2 is a sectional view of an intermediate stage in a process of preparing the multilayer printed wiring board of the embodiment.
Figure 3:
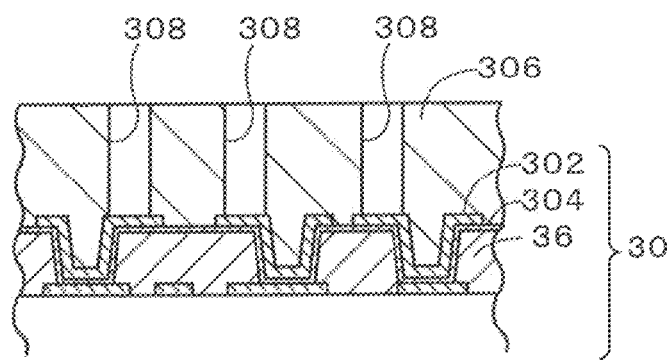
FIG. 3 is a sectional view of an intermediate stage in a process of preparing the multilayer printed wiring board of the embodiment.

First, the core substrate 20 with build-up layers 30 formed thereon was prepared. FIG. 2 is a partial section of a build-up layer 30 that is formed on the upper surface of the core substrate 20. At this stage, the top surface of the uppermost resin insulating layer 36 is still covered with an electroless copper plating layer 304. That is, this is the stage wherein, after electroless copper plating had been applied to the resin insulating layer 36 upon forming through holes and electrolytic copper plating had been applied, after forming a photoresist on the electroless copper plating layer 304 and performing patterning, to portions at which the photoresist had not been formed so as to form the electroless copper plating layer 304 and an electrolytic copper plating layer, the photoresist has been peeled off. Thus, in regard to the conductor layers, whereas the electrolytic copper plating layer has been patterned and has become a patterned plating layer 302, the electroless copper plating layer 304 is left as it is. The thickness of the electroless copper plating layer 304 is several μm. A dry film 306 (formed by overlapping two sheets of CX-A240, made by Asahi Kasei Corporation.; thickness: 240 μm) is then adhered onto the upper surface of such a build-up layer 30 and openings 308 of 120 μmφ are formed at predetermined positions by a carbon dioxide gas laser (see FIG. 3).

Figure 4:
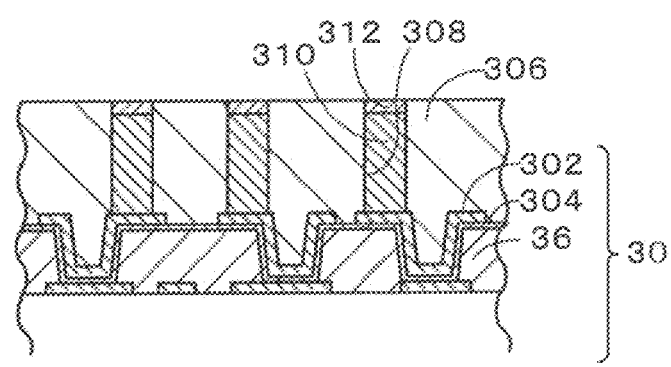
FIG. 4 is a sectional view of an intermediate stage in a process of preparing the multilayer printed wiring board of the embodiment.
Figure 5:
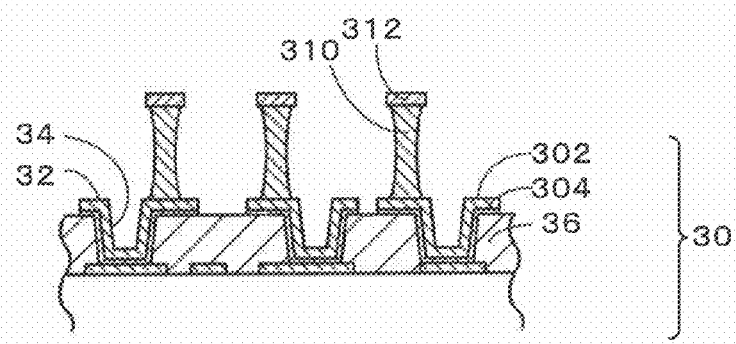
FIG. 5 is a sectional view of an intermediate stage in a process of preparing the multilayer printed wiring board of the embodiment.
Figure 6:
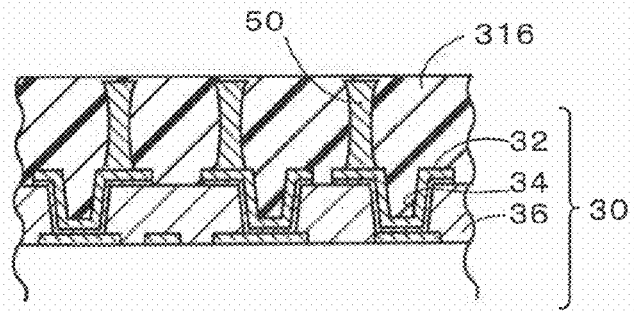
FIG. 6 is a sectional view of an intermediate stage in a process of preparing the multilayer printed wiring board of the embodiment.
Figure 7:
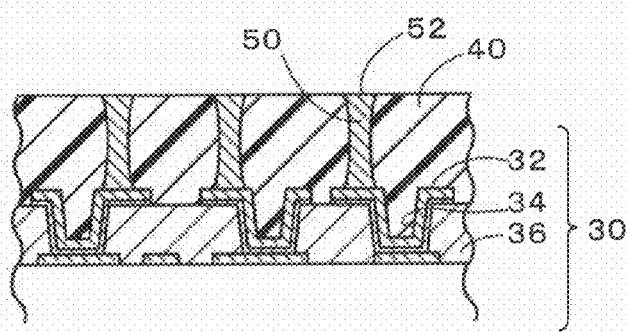
FIG. 7 is a sectional view of an intermediate stage in a process of preparing the multilayer printed wiring board of the embodiment.

Electrolytic copper plating is then performed from bottom portions of openings 308 of the dry film 306 to fill the interiors of openings 308 with columnar copper layers 310, and solder layers 312 are furthermore formed on the upper surfaces of copper layers 310 (see FIG. 4). The composition of the electrolytic copper plating solution used was: 2.24 mol/l of sulfuric acid, 0.26 mol/l of copper sulfate, and 19.5 ml/l of an additive (Cupracid GL, made by ATOTECH Japan Co., Ltd.). The electrolytic copper plating was carried out under the conditions of a current density of 1 A/dm$^2$, a duration of 17 hours, and a temperature of 22±2° C.

Then, after peeling off the dry film 306 (see FIG. 5), the substrate in the middle of preparation was etched by immersion in an ammonia alkali etching solution (trade name: A-Process, made by Meltex Inc.). By this etching, electroless copper plating layer 304 was removed from portions that had been covered with the dry film 306, that is, the portions that had not been covered by the electrolytic copper plating layer 302, and the intermediate portions of columnar copper layers 310 were formed to shapes with constrictions (see FIG. 5). As a result, in the electrolytic copper plating layer 302 and electroless copper plating layer 304, the portions on the upper surface of the resin insulating layer 36 become the conductor pattern 32 and the through hole portions become via holes 34. Here, solder layers 312 function as etching resists. The degree to which the intermediate portions of copper layers 310 are etched can be controlled by means of the etching time. For example, if the etching time is set to 10 to 60 seconds, the maximum diameter (the diameter of the upper portion or the lower portion) of a copper layer 310 will be 60 to 120 μm and the diameter of the intermediate portion will be 30 to 60 μm. The maximum diameter and the diameter of the intermediate portion may be made other values than the above-mentioned values by changing the diameter of openings 308.

After removing solder layers 312 by immersion in a solder stripping agent (trade name: Enstrip TL-106, made by Meltex Inc.), a resin film 316 (500 MPa), with which 60 vol % of urethane resin is dispersed in an epoxy resin having a curing agent dispersed therein, was laminated (see FIG. 6) onto the substrate in the middle of preparation and cured at 150° C. for 60 minutes, and thereafter polishing was carried out until the top surfaces of conductor posts 50 became exposed (see FIG. 7). After the polishing, the resin film 316 becomes the low elastic modulus layer 40. The top surfaces of the conductor posts 50 that are exposed from the low elastic modulus layer 40 become lands 52. In the final stage, the conductor posts 50 became 200 μm in height.

Figure 8:
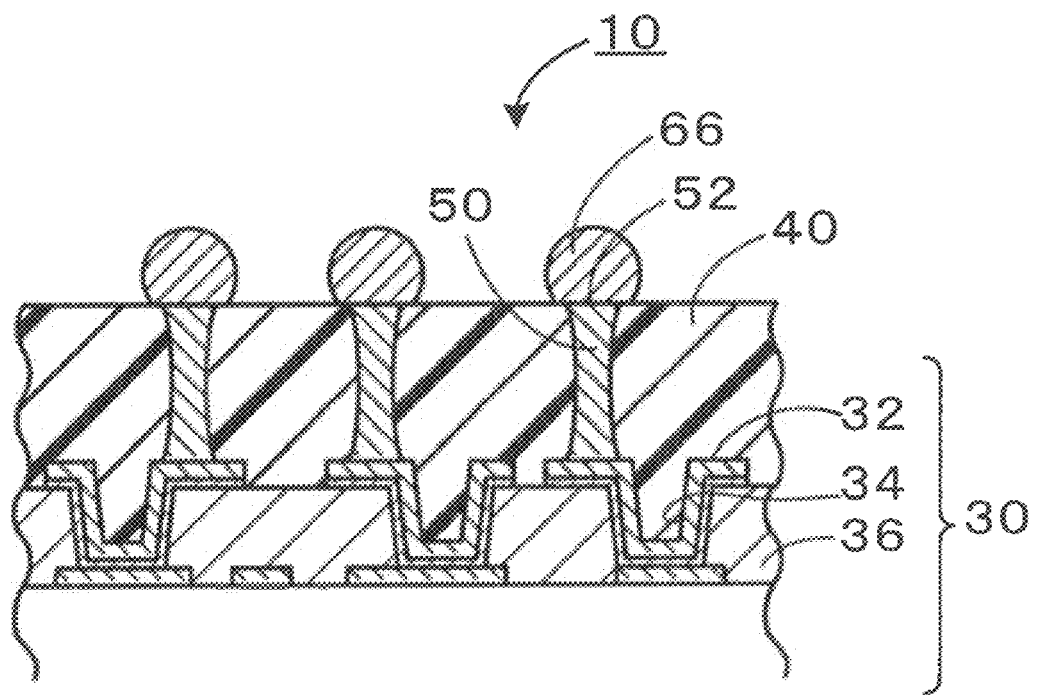
FIG. 8 is a sectional view of an intermediate stage in a process of preparing the multilayer printed wiring board of the embodiment.

The substrate in the middle of preparation was then immersed in an acidic solution containing a palladium catalyst that activates the copper surface and was thereafter immersed for 20 minutes in an electroless nickel plating solution of pH 5, comprising 30 g/l of nickel chloride, 10 g/l of sodium hypophosphite, and 10 g/l of sodium citrate, to form a nickel plating layer of 5 μm thickness on lands 52. This substrate was furthermore immersed for 23 seconds under the condition of 93° C. in an electroless gold plating solution, comprising 2 g/l of gold potassium cyanide, 75 g/l of ammonium chloride, 50 g/l of sodium citrate, and 10 g/l of sodium hypophosphite, to form a gold plating layer of 0.03 μm thickness on top of the nickel plating layer. Solder bumps 66 were formed on lands 52 by printing on a solder paste using a mask pattern and performing reflow at 200° C. The multilayer printed wiring board 10 was thus manufactured (see FIGS. 8 and 1).

In the multilayer printed wiring board 10 of the embodiment described above, since the aspect ratio Rasp of conductor posts 50 is appropriate, even if stress occurs due to the thermal expansion coefficient difference of the core substrate 20 and semiconductor chip 70, this stress can be relaxed definitely. In the multilayer printed wiring board 10 constructed as above, breakdown of connection with the semiconductor chip 70 and breakage of the insulating layer of the semiconductor chip 70 are adequately prevented and the percentage variation of the electrical resistance upon repeated heating and cooling is restrained at a low level. Thus, power can be supplied with stability to the semiconductor chip 70. Also, since the diameter of the thinnest portion of each conductor post 50 exceeds 30 μm, voltage drops during supply of power to the semiconductor chip 70 can be restrained and erroneous operation of the semiconductor chip 70 can thereby be prevented. This effect becomes especially prominent when an IC chip 70 of 3 GHz or more is mounted. Furthermore, since conductor posts 50 are formed to a shape with a constriction and the ratio of the diameter of the thickest portion with respect to the diameter of the thinnest portion (thickest portion/thinnest portion) is not less than 2, the percentage variation of the electrical resistance upon repeated heating and cooling can be restrained further in comparison to conductor posts of substantially straight shapes. This is because conductor posts 50 deform together with the low elastic modulus layer 40. These effects have been proven as shall be described later with Examples. Furthermore, since the top surfaces of conductor posts 50 formed to be coplanar with the upper surface of the low elastic modulus layer 40 and are used as lands 52, preparation is simple in comparison to a case where lands are formed separately from conductor posts 50. Since the Young's modulus at 30° C. of the low elastic modulus layer 40 is 10 MPa to 1 GPa, stress due to the thermal expansion coefficient difference can be relaxed more definitely.

The present invention is by no means restricted to the above-described embodiment and can obviously be put into practice by various modes within the scope of the art of the invention.

In the above-described embodiment, the conductor posts 50 was formed to have a shape with a constriction. A substantially straight columnar shape may be employed instead. In a case where the shape of conductor posts 50 is of a substantially straight columnar shape, etching is performed, for example, by spraying an etching solution in the form of a straight line by means of a slit nozzle, etc. Even in this case, as long as the aspect ratio Rasp of conductor posts 50 is not less than 4 and is less than 20, breakdown of connection with the semiconductor chip 70 due to thermal expansion and thermal contraction can be prevented and erroneous operation of the semiconductor chip 70 can be prevented as in the embodiment described above. Here, it is preferable to make the diameter of the transverse section of each conductor post 50 exceed 30 μm since the voltage drop amount can then be held at a low level. However, since conductor posts 50 may impede the deformation of the low elastic modulus layer 40 if the diameter exceeds 80 μm, the diameter is preferably made greater than 30 μm but not more than 80 μm. These points have also been verified as shall be described later with the Examples.

The solder resist layer may be formed on the low elastic modulus layer 40 of the above-described embodiment. In this case, openings are provided in the solder resist layer so that lands 52 will be exposed to the exterior. Such a solder resist layer may be formed by a normally used method.

In the above embodiment, a single low elastic modulus layer 40 equipped with conductor posts 50 is formed on the build-up layer 30. A plurality of layers may be laminated instead.

In the above embodiment, lands 52 are arranged as the top surfaces of conductor posts 50, that is, portions of conductor posts 50. The lands 52 may be arranged as separate members from conductor posts 50.

EXAMPLES

Examples for verifying the effects of the multilayer printed wiring board 10 of the embodiment shall now be described. First, the relationship between the aspect ratio Rasp of the conductor posts and the percentage variation of the electrical resistance after repeating heating and cooling shall be described. Here, the multilayer printed wiring boards with conductor posts of Examples 1 to 12, shown in the table of FIG. 9, were prepared in accordance with the above-described embodiment. Specifically, in each Example, the hole diameter of openings 308, to be formed in the dry film 306 (thickness: 240 μm) using a carbon dioxide gas laser, was set in accordance with the maximum diameter of the conductor posts, and the etching time of the copper layer 310 in FIG. 5 was set in accordance with the minimum diameter of the conductor posts. Conductor posts that have the same value in the minimum diameter and the maximum diameter are substantially straight, columnar conductor posts, and conductor posts having different values in the minimum diameter and the maximum diameter are conductor posts of shapes with constrictions. For conductor posts of straight shape, spray etching using a slit nozzle was employed. On the thus prepared multilayer printed wiring board of each Example, an IC chip was mounted and the interval between the IC chip and the multilayer printed wiring board was filled with a sealing resin to prepare an IC mounted board. The electrical resistance of a specific circuit passing through the IC chip (the electrical resistance across a pair of electrodes, which are exposed on the surface at the side opposite the IC chip mounting surface of the IC mounted board and are continuous with the IC chip) was measured and this value was used as an initial value. The IC mounted boards were then subject to a heat cycle test in which a cycle of −55° C.×for 5 minutes and 125° C. for 5 minutes was repeated 1500 times. In this heat cycle test, the electrical resistance was measured at the 500th, 750th, 1000th, and 1500th cycle, and the percentages of variation with respect to the initial value (100×(measured value−initial value)/initial value (%)) were determined. The results are shown in the table of FIG. 9. In this table, cases wherein the percentage variation of the electrical resistance was within ±5% are indicated as being "good" (○), cases wherein the percentage variation was ±5 to 10% are indicated as being "normal" (Δ), and cases wherein the percentage variation exceeded ±10% are indicated as being "poor" (x). The target specification was set to a percentage variation of within ±10% (that is a "normal" or "good" evaluation) at the 1000th cycle.

As is clear from this table, whereas a "good" evaluation result is obtained at least up to the 1000th cycle for examples with the aspect ratio Rasp of not less than 4, a "poor" evaluation result is obtained in most of examples with the aspect ratio Rasp of not more than 3.3. Also, when the aspect ratio Rasp is 20, cracks are formed in the conductor posts and disconnection occurred. With cases where the aspect ratios Rasp of the conductor posts are the same, better results were obtained with the shape with a constriction than with the substantially straight shape.

Figure 10:
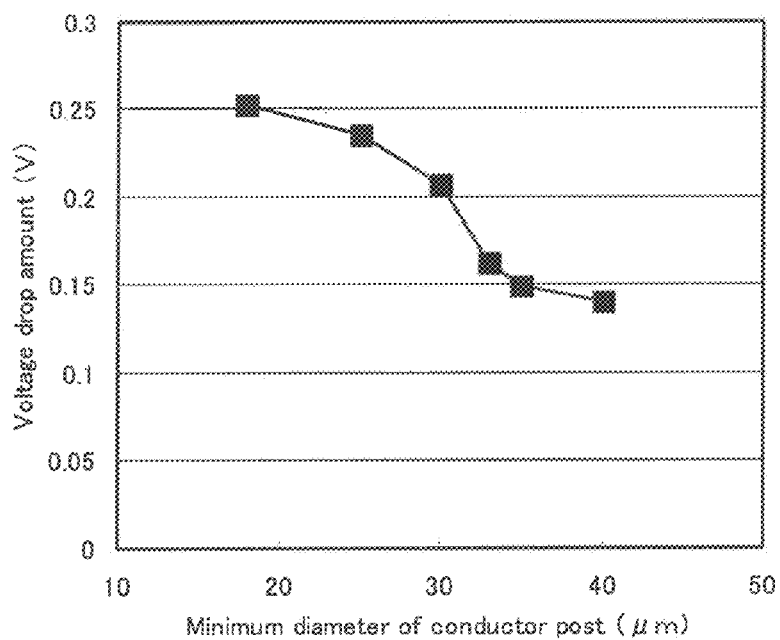
FIG. 10 shows a table and a graph of the relationship between the minimum diameter of the conductor posts and the voltage drop amount.

The relationship between the minimum diameter of the conductor posts and voltage drop shall now be described. Here, multilayer printed wiring boards of Examples 13 to 18, shown in the table of FIG. 10, were prepared in accordance with the above-described embodiment. Specifically, in each Example, the hole diameter of openings 308, to be formed in the dry film 306 (thickness: 240 μm) using a carbon dioxide gas laser, was set in accordance with the maximum diameter of the conductor posts, and the etching time of the copper layer 310 in FIG. 5 was set in accordance with the minimum diameter of the conductor posts. On the thus prepared multilayer printed wiring board of each Example, an IC chip, which is driven at a high rate of 3.1 GHz, was mounted and the amount of voltage drop upon supplying power of a fixed amount and starting up the IC chip was measured. Since the voltage of the IC chip cannot be measured directly, a circuit that enables the voltage of the IC chip to be measured was formed in the multilayer printed wiring board and the voltage drop amount was measured with the circuit. The results are shown in the table and graph of FIG. 10. Though when the transistor of the IC chip is turned ON, the voltage drops a plurality of time in accompaniment with the time elapsed, the amount of the first voltage drop was measured. The voltage drop amount in the table of FIG. 10 is the average value of voltage drop amounts of 5 times of starting up the IC chip with a power supply voltage of 1.0V. Each of the minimum diameters of the conductor posts in the table of FIG. 10 was measured after polishing the cross section, and in regard to the occurrence of erroneous operation of the IC chip, simultaneous switching was repeated 100 times and whether or not an erroneous operation occurred during that time was checked. As is clear from the graph of FIG. 10, the voltage drop amount becomes notably small near the point at which the minimum diameter of the conductor posts exceeds 30 μm. Also, though an IC chip of 1 GHz was mounted on the multilayer printed wiring board of Example 13 (see the table of FIG. 10) and whether or not erroneous operation occurs was checked in the same manner as the above, erroneous operation did not occur. When the minimum diameter of the conductor posts exceeds 80 μm, since the conductor posts become high due to the need to make the aspect ratio Rasp not less than 4 and the wire length thus becomes long, the minimum diameter preferably exceeds 30 μm and is yet not more than 80 μm.

The relationship between the aspect ratio of the conductor posts and the stress applied to the insulating layer of an IC chip shall now be described. A 3D strip simulation was carried out wherein the conductor post aspect ratio Rasp was varied while keeping the thermal expansion coefficients, elastic moduli, and Poisson's ratios of the respective component materials of the IC chip, low elastic modulus layer, solder bumps, conductor posts, core substrates, etc., fixed, and the ratios (referred to hereinafter simply as the "stress ratios") of the stresses applied to the insulating layer of the IC chip with conductor posts of various aspect ratios Rasp with respect to the stress applied to the insulating layer of the IC chip with conductor posts of an aspect ratio Rasp of 1 were calculated.

Figure 11:
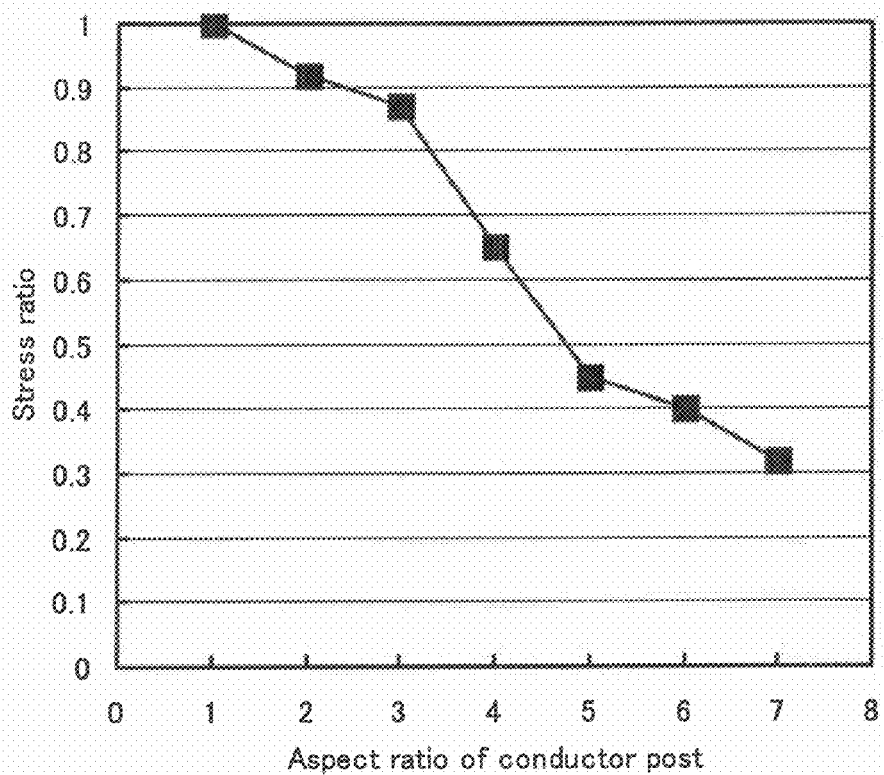
FIG. 11 shows a table and a graph of the relationship between the aspect ratio of the conductor posts and the stress ratio.
Figure 12:
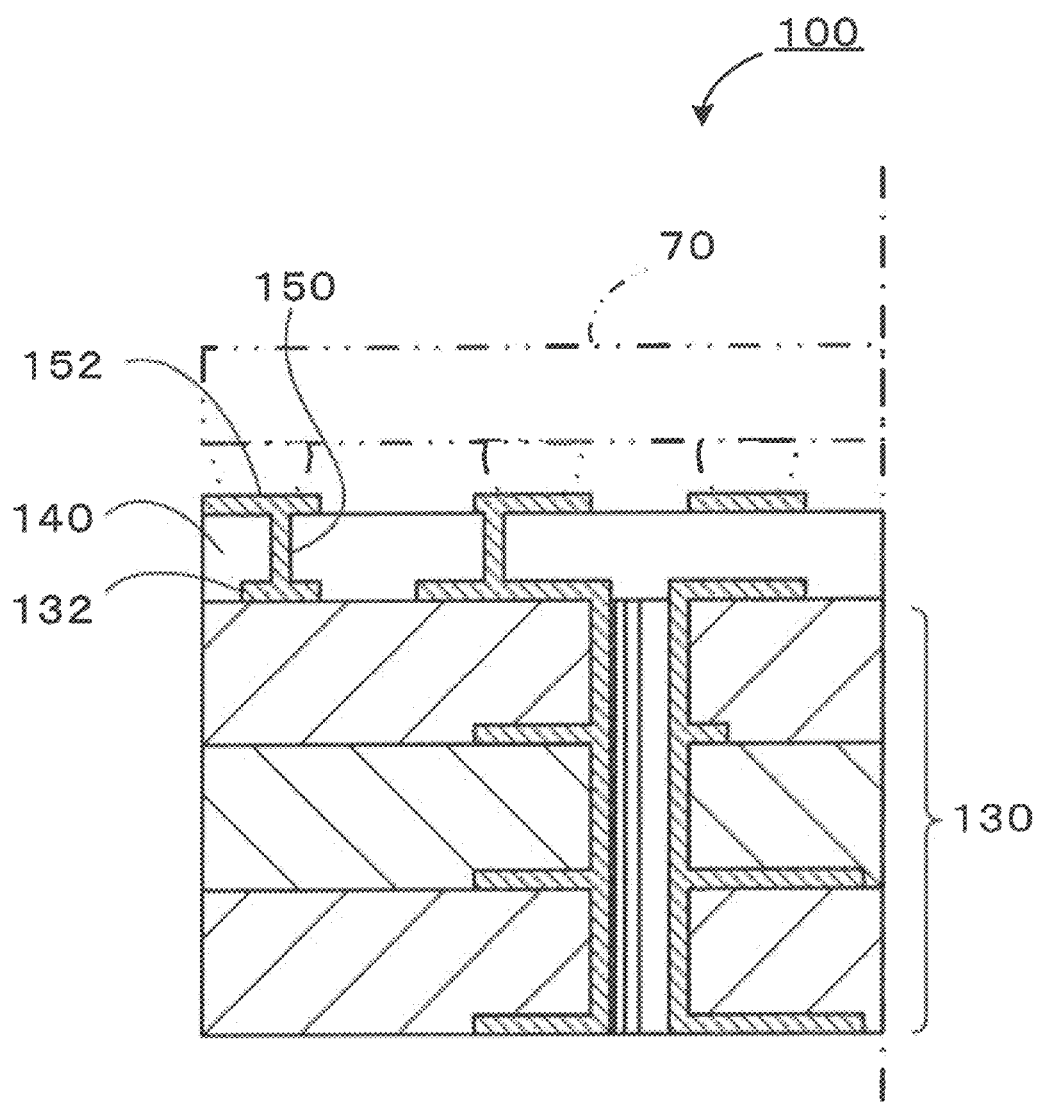
FIG. 12 is a sectional view of a multilayer printed wiring board of a conventional example.

The results are shown in the table and graph of FIG. 11. As is clear from this table and graph, the stress ratio varies greatly at the point at which the aspect ratio Rasp becomes 4. That is, whereas the stress ratio is small when the aspect ratio Rasp is not less than 4, the stress ratio becomes large when the aspect ratio Rasp becomes less than 4.

Further Examples shall now be described. First, the relationship between the conductor post aspect ratio Rasp and the percentage variation of the electrical resistance after repeating heating and cooling shall be described. Here, multilayer printed wiring boards with conductor posts of Examples 19 to 73, shown in the table of FIG. 13, were prepared in accordance with the above-described embodiment. Specifically, in each Example, the hole diameter of openings 308, to be formed using a carbon dioxide gas laser in the dry film 306, with which the thickness was changed variously in accordance with the conductor post height (see FIG. 3; the thickness may be adjusted, for example, by adjusting the number of sheets of film used), was set in accordance with the maximum diameter of the conductor posts, and the etching time of the copper layer 310 in FIG. 5 was set in accordance with the minimum diameter of the conductor posts. Conductor posts, with which the minimum diameter and the maximum diameter are the same, are substantially straight, columnar conductor posts, and conductor posts, with which the minimum diameter and the maximum diameter differ, are conductor posts of shapes with constrictions. For conductor posts of straight shape, spray etching using a slit nozzle was employed. On the thus prepared multilayer printed wiring board of each Example, an IC chip was mounted and the interval between the IC chip and the multilayer printed wiring board was filled with a sealing resin to prepare an IC mounted board. The same heat cycle test as that conducted on the above-described Examples 1 to 18 was then carried out. However, the electrical resistance was measured and evaluation was carried out at the 1750th cycle, the 2000th cycle, and the 2500th cycle as well. The results are shown in the table of FIG. 13. The meanings of ○, Δ, and x in this table are the same as those of FIG. 9.

The results of FIG. 13 show that when the aspect ratio Rasp is not less than 4 and is less than 20, a "normal" (Δ) or a "good" (○) evaluation result is obtained at least up to the 1000th cycle. Meanwhile, when the aspect ratio Rasp is less than 4 or not less than 20, a "poor" evaluation result is obtained at the 1000th cycle. This is presumed to be because when the aspect ratio Rasp is less than 4, even when the low elastic modulus layer tends to become deformed, the conductor posts impede this deformation, while when the aspect ratio Rasp is not less than 20, the conductor posts deform too much and undergo fatigue degradation. Good results were obtained for a greater number of cycles especially when the aspect ratio Rasp is not less than 4 and not more than 6.5. Also, a comparison of conductor post shapes for cases where the aspect ratio Rasp is not less than 4 and less than 20 shows that whereas with constricted shapes, "normal" or "good" evaluations were obtained up to at least 1500 cycles, with straight shapes, "normal" or "good" evaluations were obtained up to at least 1000 cycles, but "poor" or "normal" results were obtained at 1500 cycles. This is presumed to be due to the constricted shapes being more easily deformed, with the constriction as the center, along with the low elastic modulus layer. Meanwhile, in regard to the minimum diameter of the conductor post, favorable results were obtained when the minimum diameter exceeds 30 μm and yet is not more than 60 μm. This is presumed to be due to fatigue degradation occurring upon repeated deformation due to the diameter being thin when the minimum diameter is not more than 30 μm, and deformation of the conductor posts becoming difficult when the minimum diameter exceeds 60 µm. Also, a comparison of Examples 22 to 24 and 35 to 37 having the maximum diameter/minimum diameter ratio of the conductor posts of not less than 2, and Examples 25 to 27 and 38 to 40 having the above ratio of less than 2, shows the former to be higher in long-term reliability. This is presumed to be due to the conductor posts being readily deformable suitably when the maximum diameter/minimum diameter ratio is large.

The resin insulating layer (trade name: ABF-45SH; made by AJINOMOTO Co., Inc.; Young's modulus: 3.0 GPa), used for forming the build-up layer, was employed in place of the low elastic modulus layer, in order to prepare conductor posts in the same manner as Example 22. On thus prepared example, the same evaluation test as that conducted on each of the above-described Examples was conducted, and the "poor" (x) result was obtained at just the 500th cycle. This is presumed to be due to stress not being relaxed due to the employment of the resin insulating layer, which is high in elastic modulus, in place of the low elastic modulus layer.

The present invention claims benefit of priority to Japanese Patent Application No. 2004-023271 filed on Jan. 30, 2004, and Japanese Patent Application No. 2004-139862 filed on May 10, 2004, the contents of which are incorporated by reference herein in their entirety.

What is claimed is:

1. A method for manufacturing a multilayer printed wiring board, comprising:
   forming a plurality of openings through a film adhered onto an upper surface of a build-up layer formed on a core substrate and a conductor pattern formed on the upper surface of the build-up layer;
   plating the plurality of openings such that a plurality of conductor posts, which are of substantially a uniform thickness, is formed in the plurality of openings, respectively, on the conductor pattern on the upper surface of the build-up layer;
   forming a plurality of resist layers on top surfaces of the conductor posts, respectively;
   removing the film from the upper surface of the build-up layer such that the conductive posts are exposed;
   immersing the conductive posts in an etching solution for a sufficient duration such that the conductor posts are shaped to have constricted portions, respectively;
   removing the resist layers from the top surfaces of the conductive posts;
   forming a low elastic modulus layer of substantially a same height as heights of the conductor posts on the upper surface of the build-up layer; and
   forming mounting electrodes on the top surfaces of the conductor posts, respectively.

2. The method for manufacturing a multilayer printed wiring board according to claim 1, wherein the forming of the low elastic modulus layer comprises forming the low elastic modulus layer to cover the conductive posts and the upper surface of the build-up layer and polishing the low elastic modulus layer such that the top surfaces of the conductive posts are exposed.

3. The method for manufacturing a multilayer printed wiring board according to claim 1, wherein the plating comprising plating the openings with an electrolytic plating material.

4. The method for manufacturing a multilayer printed wiring board according to claim 1, wherein the plating comprising plating the openings with an electrolytic copper material.

5. The method for manufacturing a multilayer printed wiring board according to claim 1, the immersing comprises immersing the conductive posts in an ammonia alkali etching solution.

6. The method for manufacturing a multilayer printed wiring board according to claim 1, further comprising forming a solder resist layer on the low elastic modulus layer and the top surfaces of the conductor posts.

7. The method for manufacturing a multilayer printed wiring board according to claim 1, wherein the forming of the resist layers comprises forming a plurality of metal layers as the resist layers on the top surfaces of the conductor posts, respectively.

8. The method for manufacturing a multilayer printed wiring board according to claim 1, wherein the forming of the resist layers comprises forming a plurality of solder layers as the resist layers on the top surfaces of the conductor posts, respectively.

* * * * *